US010509065B1

(12) United States Patent
Shaffer

(10) Patent No.: US 10,509,065 B1
(45) Date of Patent: Dec. 17, 2019

(54) IMAGING OF ELECTROMAGNETIC FIELDS

(71) Applicant: Quantum Valley Ideas Laboratories, Waterloo (CA)

(72) Inventor: James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 16/410,479

(22) Filed: May 13, 2019

Related U.S. Application Data

(63) Continuation of application No. PCT/CA2019/050384, filed on Mar. 28, 2019.
(60) Provisional application No. 62/786,677, filed on Dec. 31, 2018.

(51) Int. Cl.
*G01R 29/08* (2006.01)
*G01R 29/10* (2006.01)

(52) U.S. Cl.
CPC ..... *G01R 29/0885* (2013.01); *G01R 29/0892* (2013.01); *G01R 29/10* (2013.01)

(58) Field of Classification Search
CPC . G01R 29/0885; G01R 29/0892; G01R 29/10
USPC ......................................................... 324/97
See application file for complete search history.

(56) References Cited

U.S. PATENT DOCUMENTS

| | | | | |
|---|---|---|---|---|
| 7,859,350 | B1* | 12/2010 | Schwindt | ................ H03L 7/099 331/3 |
| 2009/0256638 | A1* | 10/2009 | Rosenbluh | .............. G04F 5/145 331/3 |
| 2013/0270434 | A1* | 10/2013 | Nelson | ................... H03B 17/00 250/305 |
| 2015/0192532 | A1* | 7/2015 | Clevenson | ........... G01R 33/323 324/304 |
| 2016/0363617 | A1 | 12/2016 | Anderson et al. | |
| 2019/0187198 | A1 | 6/2019 | Anderson et al. | |

OTHER PUBLICATIONS

Vrijsen, Geert FN. Collective quantum behavior of atomic ensembles in high-finesse optical cavities. Diss. Stanford University, 2011 . (Year: 2011) (Year: 2011).*
https://cdn.rohde-schwarz.com/dk/seminars_workshops/BaseStationInstallationandAntennaTesting_2017_V1_Shared_DK.pdf retrieved Nov. 7, 2018, 40 pgs.

(Continued)

*Primary Examiner* — Christopher P McAndrew
(74) *Attorney, Agent, or Firm* — Henry Patent Law Firm PLLC

(57) ABSTRACT

In a general aspect, fields of electromagnetic radiation are imaged. In some aspects, an imaging method includes receiving electromagnetic radiation at a vapor-cell sensor. The method also includes passing beams of light through the vapor-cell sensor, one or more of the beams of light reflecting off a dielectric mirror of the vapor-cell sensor. The method additionally includes receiving at least one of the beams of light at an optical imaging system. The optical imaging system is configured to measure spatial properties of a beam of light. The method also includes determining one or both of an amplitude and a phase of the electromagnetic radiation based on spatial properties of the at least one received beam of light. Systems for imaging fields of electromagnetic radiation are also presented.

32 Claims, 5 Drawing Sheets

(56) References Cited

OTHER PUBLICATIONS

"Analyzing RFoCPRI(TM) at Fiber-Based Cell Sites", https://www.viavisolutions.com/en-us/literature/analyzing-rfocpri-fiber-based-cell-sites-application-notes-en.pdf retrieved Nov. 7, 2018, 2 pgs.
"Drone Cell Tower Inspection, Survey, Thermal Imaging and LIDAR", https://abjdrones.com/drone-cell-tower-inspection-services retrieved Nov. 7, 2018, 6 pgs.
"inUAVI: Developing advanced electronic sensors and payloads for UAV's and Aerospace", http://inuavi.io retrieved Nov. 7, 2018, 5 pgs.
Fan, et al., "Atom based RF electric field sensing", Journal of Physics B: Atomic, Molecular and Optical Physics, Sep. 9, 2015, 17 pgs.
Fan, et al., "Dispersive radio frequency electrometry using Rydberg atoms in a prism-shaped atomic vapor cell", J. Phys. B: At. Mol. Opt. Phys. 49, 2016, 8 pgs.
Fan, et al., "Effect of Vapor-Cell Geometry on Rydberg-Atom-Based Measurements of Radio-Frequency Electric Fields", Physical Review Applied 4, 044015, 2015, 7 pgs.
Fan, et al., "Subwavelength microwave electric-field imaging using Rydberg atoms inside atomic vapor cells", Optics Letters, vol. 39, No. 10, May 15, 2014, 4 pgs.
Goodman, "Introduction to Fourier Optics", McGraw-Hill Companies, Inc., 1968, 457 pgs.
Holloway, et al., "Atom-Based RF Electric Field Measurements: An Initial Investigation of the Measurement Uncertainties", IEEE International Symposium on Electromagnetic Compatibility, 2015, 6 pgs.
Kumar, et al., "Atom-Based Sensing of Weak Radio Frequency Electric Fields Using Homodyne Readout", Scientific Reports 7:42981, Feb. 20, 2017, 10 pgs.
Kumar, et al., "Rydberg-atom based radio-frequency electrometry using frequency modulation spectroscopy in room temperature vapor cells", Optics Express, vol. 25, No. 8, Apr. 17, 2017, 13 pgs.
Schnars, "Direct phase determination in hologram interferometry with use of digitally recorded holograms", J.Opt. Soc.Am.A, vol. 11, No. 7, Jul. 1994, 5 pgs.
Sedlacek, et al., "Atom-Based Vector Microwave Electrometry Using Ribidium Rydberg Atoms in a Vapor Cell", Physical Review Letters, Aug. 6, 2013, 5 pgs.
Sedlacek, et al., "Microwave electrometry with Rydberg atoms in a vapour cell using bright atomic resonances", Nature Physics, Sep. 16, 2012, 6 pgs.
Sedlacek, et al., "Quantum Assisted Electrometry using Bright Atomic Resonances", arXiv:1205.4461v1 [physics.atom-ph], May 20, 2012, 15 pgs.
Shaffer, et al., "A read-out enhancement for microwave electric field sensing with Rydberg atoms", SPIE Photonics Europe, 2018, Strasbourg, France, 2018, 11 pgs.
Anderson, et al., "A self-calibrating SI-traceable broadband Rydberg atom-based radio-frequency electric field probe and measurement instrument", arXiv:1910.07107v2 [physics.atom-ph], Oct. 18, 2019, 12 pgs.

\* cited by examiner

IMAGING OF ELECTROMAGNETIC FIELDS

CROSS-REFERENCE TO RELATED APPLICATIONS

This application is a continuation of International App. No. PCT/CA2019/050384, filed Mar. 28, 2019, which claims priority to U.S. Provisional Application Ser. No. 62/786,677, entitled "Holographic Imaging of Electromagnetic Fields," filed Dec. 31, 2018, the disclosures of which are hereby incorporated by reference.

BACKGROUND

The following description relates to imaging of electromagnetic fields.

Over-the-air (OTA) testing is important for many systems that utilize electromagnetic radiation for obtaining and communicating information (e.g., radar systems, medical imaging systems, cellular systems, etc.). The importance of OTA testing increases as electromagnetic frequencies scale to higher frequencies (e.g., greater than 30 GHz) as system integration between multiple components becomes more tightly-knit. An example of system integration in high-frequency electronics is the merging of antennas with transceiver systems and amplifiers. Testing of such highly-integrated and sophisticated systems, particularly in the mm-wave regime, is widely recognized as a looming problem for the automotive and transportation, radar and telecommunications industries. The problem is so fundamental that industry analysts projected the problem to adversely affect market growth in the near future. Moreover, the problem of increasing scales of production is a significant challenge and industry concern when a system or device achieves mass-market penetration.

DETAILED DESCRIPTION

Figure 1:
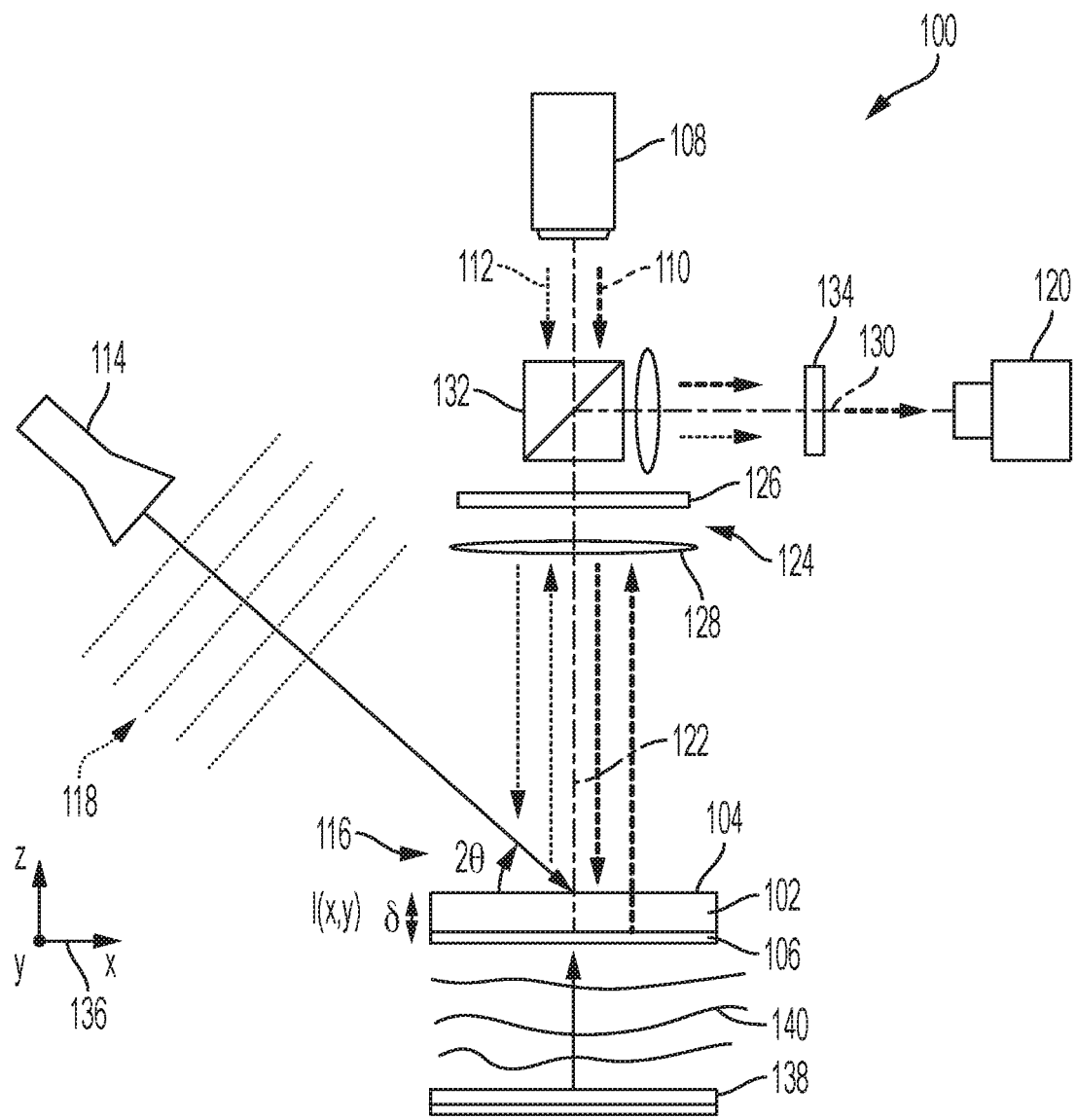
FIG. 1 is a schematic diagram of an example imaging system that includes a vapor-cell sensor.

In some aspects of what is described here, radiated electric field phase and amplitude information is obtained from a device under test (e.g., using Rydberg atom electrometry) so that antennas and other high frequency (GHz-THz) devices and electronics can be tested (e.g., over the air). An imaging system can measure, or image, an interference pattern between two radiated electric fields produced by a device-under-test (DUT) and a reference antenna using Rydberg atom electrometry or other techniques. The imaging system can create an image from which a phase or an amplitude (or both) of a test radiated electric field can be retrieved. The reference antenna may produce a plane wave at the position of measurement and can be referenced via feedback to a Rydberg atom sensor used as an absolute calibration source. An atomic vapor-cell sensor (or Rydberg atom sensor) can be optically coupled to a readout device so that wires do not have to be used in a measurement area of the imaging system.

The atomic vapor-cell sensor can be implemented as a dielectric vapor cell that is filled with atoms or molecules. The dielectric vapor cell is large enough to image the electric- or magnetic-field components of an electromagnetic radiation in the region of the device-under-test. The radiated electric field phase and amplitude information can be acquired rapidly (e.g., in real time) so that the device-under-test can be tuned or tested, for example, using a matched, spatial filter to which a measured radiation pattern is correlated. Such tuning or testing may result in the device-under-test being passed/failed on an assembly line. In some implementations, the imaging system may include another type of sensor. For example, the imaging system may include an atom or molecule-like sensor that incorporates color centers in a solid or liquid matrix.

The imaging systems and measurement techniques described herein can be used in development or for product testing, e.g., for production line testing, for certification, or for other purposes. In some cases, the imaging system uses an absolute sensor that may be used as a standard (e.g., an atomic vapor-cell sensor). Shielding around the measurement area may be reduced in size by using a more electromagnetically-transparent sensor and associated componentry. Such transparency may make the imaging system or its components more compact. Moreover, a spatial resolution of the sensor can be determined by the imaging resolution of a readout light on a light detector (e.g., an image size on a CCD array). The detection system is operable to receive beams of light that have passed through the sensor. The spatial resolution is not necessarily limited by the size of the light detector or a size of an antenna used to detect the electric field or the carrier wavelength. High throughput can be achieved, for example, using fast optical imaging and digital imaging processes.

Millimeter waves and integrated devices can present unique challenges for measurement and testing. For example, millimeter waves allow the development of small sized antennas and multiple-element phased arrays on a substrate chip. However, interplay between the antenna, chip elements and substrate can affect system performance in a notable way. These types of antennas generally cannot be designed independent of the circuit board to which they are fastened, or even packaging that surrounds them. For hand-held or wearable devices, it is often important to test the effect a human body may have on a functionality of such devices. Full system testing may be applied in a variety of contexts, for example, in the research and development (R&D) phase and production phase. In some contexts, each device must comply with a range of regulations, standards or other types of requirements before it can enter the market. Moreover, vendors have an interest in having their products comply with specifications in order to compete. Accordingly, over-the-air (OTA) testing will be useful for assembly lines, in development labs, and other commercial and research settings.

In some implementations of the imaging systems and measurement techniques described here, testing of high-frequency electronics (e.g., particularly antennas at frequencies greater than 30 GHz) includes precisely scanning an antenna in a way that the measurement does not interfere with the device-under-test. Testing can be done, for example, at the R&D stage to identify the pattern of electromagnetic waves emitted from the device-under-test. For many developing technologies, such as driverless cars that rely on radar systems, rigorous standards can be evaluated and certified using OTA testing to ensure safety and functionality. Examples highlighting the importance of meeting strict specifications include devices that are intended for advanced 5G communication. In such devices, the communication wavelength of electromagnetic radiation becomes shorter, and the transmission distance for a given power level decreases. Beam forming and side-lobe suppression are often critical for the functionality of such devices.

Further enhancement to multiple-in, multiple-out (MIMO) beamforming technologies will have new designs for high-frequency integrated circuit components such as power amplifiers and transceivers to be integrated with the antenna modules. Various entities (e.g., vendors and carriers) may optimize communication ranges through increases in transmitted power or enhanced focusing of radiated energy into a sharp and narrow beam to ensure high connectivity. Testing of these properties can be complicated, for example, due to the high levels of system integration. Analogous issues may be encountered in a broad range of industries such a transportation, automation, communications, and medicine where high frequency signaling is becoming more prevalent. Internet of Things (IoT) based improvements to cities, healthcare, industrial manufacturing and autonomous vehicles are all areas of applicability.

More efficient OTA testing will save a considerable amount of cost in the near future through faster time-to-market development, better quality control and higher-efficiency devices. More sophisticated and advanced products can be enabled by efficient OTA testing. In some cases, OTA testing can measure the functionality of an entire system. OTA testing is already required for Cellular Telecommunications and Internet Association (CTIA) certification of wireless devices as well as other standards bodies such as the European Telecommunications Standards Institute (ETSI). With wireless devices becoming more and more compact, evaluating the performance of these devices and systems is more important. OTA testing can evaluate device performance and predict reliability in the target environment. Assembly line testing is also important as devices become more and more complicated since failure rates cannot only lose a company business but even result in lawsuits and costly recalls.

Now referring to FIG. 1, a schematic diagram is presented of an example imaging system 100 that includes a vapor-cell sensor 102. The vapor-cell sensor 102 includes an optical window 104 and a dielectric mirror 106. The optical window 104 and the dielectric mirror 106 may be planar in shape and parallel to each other, as shown in FIG. 1. However, other configurations are possible for the optical window 104 and a dielectric mirror 106. The example imaging system 100 also includes a laser system 108 that is configured to generate a least two beams of light. Each beam of light may be a coherent beam of light defined, in part, by a wavelength that is concentrated around a single value (e.g., a beam of laser light). FIG. 1 depicts the laser system 108 as configured to generate two beams of light, i.e., a first beam of light 110 and a second beam of light 112. However, greater numbers are possible for the at least two beams of light. For example, the laser system 108 may be configured to generate three beams of light.

The example imaging system 100 additionally includes a reference antenna 114 disposed on a side 116 of the vapor-cell sensor 102 associated with the optical window 104. The reference antenna 114 is configured to generate a reference electromagnetic radiation 118 having one or both of a controlled amplitude and a controlled phase. The reference electromagnetic radiation 118 may be a plane wave of electromagnetic radiation, as illustrated in FIG. 1. However, other types of electromagnetic radiation are possible. The example imaging system 100 also includes an optical imaging system 120 configured to measure spatial properties of a beam of light. The spatial properties may correspond to an individual beam of light or a combination of multiple beams of light. The optical imaging system 120 is positioned to receive at least one of the at least two beams of light after interaction with the vapor-cell sensor 102. In some instances, the optical imaging system 120 includes a charge-coupled device (CCD).

In some implementations, such as shown in FIG. 1, the example imaging system 100 includes a first optical pathway 122 extending from the laser system 108, through the optical window 104 of the vapor-cell sensor 102, to the dielectric mirror 106. An optical assembly 124 is disposed on the first optical pathway 122 between the laser system 108 and the optical window 104 of the vapor-cell sensor 102. The optical assembly 124 may include optical components such as lenses, mirrors, filters, waveplates, beam splitters, and so forth. For example, the optical assembly 124 may include a waveplate 126 (e.g., a λ/4 waveplate) disposed on the first optical pathway 122 between the optical window 104 and the optical assembly 124. In another example, the optical assembly 124 may include a lens 128 disposed on the first optical pathway 122 between the optical window 104 and the optical assembly 124.

The example imaging system 100 also includes a second optical pathway 130 extending from the optical assembly 124 to the optical imaging system 120. The second optical pathway 130 may intersect the first optical pathway 122. For example, the second optical pathway 130 may intersect the first optical pathway 122 at an optical component of the optical assembly 124, such as at a beam splitter 132. The optical assembly 124 is configured to redirect at least one beam of light onto the second optical pathway 130 after interaction with the vapor-cell sensor 102. In some instances, the optical assembly 124 includes an optical filter 134 disposed on the second optical pathway 130 and configured to absorb or reflect wavelengths of at least one of the at least two beams of light. In this capacity, the optical filter 134 may control which and how many beams of light are received by the detection system 120.

In operation, the laser system 108 of the example imaging system 100 may generate the at least two beams of light, e.g., the first beam of light 110 and the second beam of light 112, which subsequently propagate along the first optical pathway 122 to the vapor-cell sensor 102. During such propagation, the at least two beams of light may interact with the optical assembly 124, and as a result, have one or more characteristics altered (e.g., a direction, a focal point, a polarization, a wavelength distribution, etc.). The at least two beams of light pass through the vapor-cell sensor 102 by entering through the optical window 104 and reflecting off of the dielectric mirror 106. Upon reaching the optical assembly 124, at least one of the at least two beams of light are redirected towards the optical imaging system 120. For example, if the beam splitter 128 is present, the first beam of light 110 and the second beam of light 112 may both be redirected to the optical imaging system 120. The optical filter 134 may then absorb the second beam of light 112, allowing the first beam of light 110 to continue to the optical imaging system 120.

Simultaneous with the generation of the at least two beams of light, the reference antenna 114 may generate reference electromagnetic radiation 118 that is received by the vapor-cell sensor 102. The reference electromagnetic radiation 118 interacts with vaporized atoms within the vapor-cell sensor, thereby changing an optical transmission through the vapor-cell sensor 102. Changes to the optical transmission may occur throughout an enclosed volume of the vapor-cell sensor 102 and thus be spatially-dependent. For example, FIG. 1 includes a coordinate axes 136 with they axis pointing into FIG. 1. The optical transmission (and changes thereto) may therefore be a function of three coordinate variables x, y, and z and thus be spatially-dependent in three dimensions. In variations where the vapor-cell sensor 102 is thin and planar, the optical transmission (and changes thereto) may be a function of only two coordinate variables x and y, and be spatially-dependent in two-dimensions (e.g., the x-y plane of FIG. 1). Other types of spatial dependence are possible.

Changes in the optical transmission of the vapor-cell sensor 102 may induce corresponding changes in an amplitude and a phase of the at least two beams of light. For example, one or both of the first beam of light 110 and the second beam of light 112 may experience changes in their respective amplitudes, phases, or both, while traversing the vapor-cell sensor 102. In many instances, the at least two beams of light interact with vaporized atoms throughout the enclosed volume of the vapor-cell sensor 102 and thus represent a spatial dependence of the optical transmission. The optical assembly 124 may shape the at least two beams of light to image the spatial dependence of the optical transmission. For example, the optical assembly 124 may broaden a distribution of the at least two beams of light in a focal plane such that an image of the enclosed volume can be obtained in a single measurement. In another example, the optical assembly 124 may raster a focal point of the at least two beams of light through the enclosed volume so that an image can be obtained from a series of sequential measurements.

Changes in the amplitudes, phases, or both, for each of the at least two beams of light may be measured by the optical imaging system 120. The optical imaging system 120 may convert such measurements into electrical signals that represent spatial distributions of the amplitudes, the phases, or both. In some implementations, the example imaging system 100 includes a computer system in communication with the optical imaging system 120 (e.g., via electrical signals). The computer system is configured to generate data from spatial properties of at least one beam of light received by the optical imaging system 120. The data represents one or both of a spatially-dependent amplitude and a spatially-dependent phase of electromagnetic radiation, e.g., a spatially-dependent reference amplitude and a spatially-dependent reference phase of the reference electromagnetic radiation 118. As such, the data may correspond to an image of the electromagnetic radiation, e.g., an image of the reference electromagnetic radiation 118.

During operation of the example imaging system 100, the computer system may compare an image of the reference electromagnetic radiation 118 to a target image. For example, the computer system may determine a difference between a reference amplitude and a target amplitude. The amplitudes may be spatially-dependent and define respective two-dimensional images of amplitude. In another example, the computer system may determine a difference between a reference phase and a target phase. The phases may be spatially-dependent and define respective two-dimensional images of phase. Upon completing the comparison, the computer system may instruct the reference antenna 114 to alter one or more characteristics of the reference electromagnetic radiation 118 (e.g., a position, an amplitude, a phase, a frequency, etc.). For example, the reference antenna 114 may alter one of both of the reference amplitude in response to differences relative to, respectively, the target amplitude and the target phase. Such alternation may reduce a magnitude of the difference and assist in calibrating the reference antenna 114 (or the example imaging system 100).

In some implementations, such as shown in FIG. 1, the example imaging system 100 includes a test device 138 (or device-under-test) disposed adjacent the dielectric mirror 106 of the vapor-cell sensor 102 and configured to generate test electromagnetic radiation 140. When generated, the test electromagnetic radiation 140 interacts with vaporized atoms within the vapor-cell sensor to change an optical transmission through the vapor-cell sensor 102. The test electromagnetic radiation 140 may be imaged similarly to that already described for the reference electromagnetic radiation 118. In the absence of the reference electromagnetic radiation 118, a test amplitude of the test electromagnetic radiation 140 may be directly imaged. The test amplitude may be a spatially-dependent amplitude and define a two-dimensional image of test amplitude. In some instances, the computer system may compare an image of the test electromagnetic radiation 140 to a target image. Such comparison may assist the example imaging system 100 in determining if the test device 138 is performing within specification.

The example imaging system 100 may be operated such that the test device 138 generates the test electromagnetic radiation 140 while the reference antenna 114 generates the reference electromagnetic radiation 118. In this situation, the vapor-cell sensor 102 receives a superimposed electromagnetic radiation, which corresponds to an interference pattern of the test electromagnetic radiation 140 with the reference electromagnetic radiation 118 at the vapor-cell sensor 102. The superimposed electromagnetic radiation may be imaged similarly to that already described for the reference electromagnetic radiation 118. The computer system may extract an image of the reference electromagnetic radiation 118 (previously obtained) from an image of the superimposed electromagnetic radiation to produce an image of the test electromagnetic radiation 140. The image of the test electromagnetic radiation 140 may allow a test phase of the test electromagnetic radiation 140 to be determined. The test phase may be a spatially-dependent phase and define a two-dimensional image of test phase.

The example imaging system 100 may also obtain images of the test electromagnetic radiation 140 by iterating the reference electromagnetic radiation 118 through multiple phases. For example, the example imaging system 100 may cause the reference antenna 114 to alter the reference phase of the reference electromagnetic radiation to generate a least three instances of superimposed electromagnetic radiation. Each instance may correspond to an instance of the reference electromagnetic radiation 118 at a different reference phase. In this mode of operation, the example imaging system 100 determines the test amplitude and the test phase of the test electromagnetic radiation 140 based on one or both of a superimposed amplitude and a superimposed phase for each instance of superimposed electromagnetic radiation and one or both of a reference amplitude and a reference phase for each corresponding instance of the reference electromagnetic radiation.

In some implementations, the example imaging system 100 is operable to conduct over-the-air (OTA) testing. OTA testing can measure the total radiated power (TRP), total isotropic sensitivity (TIS), effective isotropic radiated power (EIRP), and effective isotropic sensitivity (EIS) of a device-under-test, such as a wireless device. Such measurements include the characterization of radiation patterns, linearization, and sensitivity. OTA tests may be carried out on systems during their research and development, production, and integration phases (e.g., such as refitting the radar systems in a car as maintenance). Other phases or times are also possible.

In some cases, an imaging system as described herein can measure, or image, the interference pattern between the radiated electric fields produced by a device-under-test (DUT) and a fixed position reference antenna using Rydberg atom electrometry. This measurement process creates an image (or holographic image) from which the phase and amplitude of the radiated electric field can be retrieved. The reference antenna may produce a plane wave at the position of the measurement and may be referenced via feedback to a Rydberg atom sensor used as an absolute calibration source. In some cases, the measurement requires that three images be acquired in order to determine the phase and amplitude of the electromagnetic field produced by the DUT. Measurements that can accomplish this task include analogs of phase shifting holographic interferometry, where the ability to phase shift the reference wave is used to take multiple images. The measurements also include heterodyne holography, where the reference wave and/or the test wave is modulated in time or deconvolved from the interference pattern computationally. In some implementations, a holographic imaging system uses atoms as the detector. A CCD camera may be used to image the response, in the optical domain, of the atoms to the high frequency fields. In some cases, the vapor cell imaging sensor can be made thin so that high phase resolution can be achieved. The device can be specifically targeted for imaging the electromagnetic fields of high frequency devices such as antennas. The radiated electric field phase and amplitude information can be acquired (e.g., in real time) so that the DUT can be tuned or tested. This information may allow the DUT to be passed, failed or otherwise processed on an assembly line, for example, using a matched, spatial filter to which the measured radiation pattern can be correlated.

In some implementations, the imaging systems and techniques described herein can provide technical advantages and improvements. For example, one or more of the following advantages and improvements may be provided in various implementations: phase and amplitude information may be retrieved using an absolutely calibrated method; multiple field points may be measured at the same time, so that the electromagnetic field is imaged and can be used to either test or optimize the radiation pattern of the DUT; spatial resolution of the detector can be very high so that the structure of the entire field can be determined, also in the near field; the sensor can include dielectric materials so that it minimally perturbs the electromagnetic field; the measurement may be integrated into an assembly line to test antennas as they are manufactured; the formation of beams from multiple element antennas may be improved by adjusting the phase of the signals at each antenna element using the images acquired; using the holographic data, images of the electromagnetic radiation can be generated at other positions, including at the DUT, for example, using a Fresnel transform or other type of wave propagation algorithm; the thickness of the sensor (e.g., δ in FIG. 1 and FIG. 2) can be made subwavelength to obtain high phase resolution; the field intensity pattern alone may be enough to characterize a DUT. Other advantages and improvements are possible.

In FIG. 1, the example imaging system 100 includes a thin vapor-cell sensor 102, optical readout lasers 110, 112, imaging optics 124 for the lasers, and a reference antenna 114. The DUT 138 is placed near the dielectric mirror 106 of the vapor-cell sensor 102, which holds alkali atoms. The alkali atoms are used via Rydberg atom-based electric field sensing (described in the following section) to detect high frequency electric fields 140 emitted from the DUT 138 and the reference wave 118. In Rydberg atom-based electrometry, the optical fields read-out an effect that the high frequency electromagnetic fields have on the vaporized atoms contained in the vapor-cell sensor 102. In FIG. 1, a large planar vapor-cell sensor 102 is used so that the electromagnetic fields from the DUT 138 can be imaged. The vapor-cell sensor 102 is constructed so that the laser light is reflected from the rear surface (or dielectric mirror 106) of the vapor-cell sensor 102. The reflected probe laser light 110 is then imaged on an imaging device 120 so that the spatial image of the electromagnetic field emanating from the DUT 138 can be measured. The probe light 110 may be separated from the coupling laser light 112 with a narrow bandwidth optical filter 134. A reference antenna 114, whose emission amplitude can be referenced to a Rydberg atom-based sensor 102 so that the amplitude of the reference wave 118 is fixed via active feedback, also can illuminate the sensor 102. The interference pattern generated by the superposition of the reference electromagnetic wave 118 and the test electromagnetic wave 140 emitted from the DUT 138 can be used to extract the phase information about the test electromagnetic wave. The amplitude of the electromagnetic wave emitted from the DUT 138 can be extracted directly from a measurement done in absence of the reference electromagnetic wave 118.

The spatial resolution of the image is set by the spatial resolution of the imaging optics 124. The phase resolution is set primarily by the vapor cell thickness, δ, and the spatial resolution of the optical image. θ in FIG. 1 can equal about 45 degrees if additional optics, which are transparent to the high frequency radiation, are used to redirect the light. This arrangement allows for the reference wave 118 to back illuminate the sensor. The phase of the reference wave 118 can be controlled via an oscillator that drives the reference antenna 114. A variable phase allows phase shifting holography to be performed with the example imaging system 100. The vapor-cell sensor 120 acts as a photographic plate or CCD array that records the electromagnetic waves and their interference patterns. If the reference wave 118 is well-known then the information from the test electromagnetic field 140 can be extracted from the interference pattern and the test field amplitude, or some other combination of those and phase shifted interference patterns, digitally, similar to digital holography. The test electromagnetic field 140 and the reference electromagnetic field 118 can be of similar amplitude at the sensor. To acquire signals, a series of images at different probe or coupling laser frequencies 110, 112 can be measured and the spectral response of the example imaging system 100, e.g., the transmission of the probe laser 110, can be used to extract the net amplitude of the respective electric fields. In a different type of measurement, e.g., for smaller amplitude electromagnetic fields, the transmission of the probe laser 110 on resonance in the presence of the coupling laser can be used to determine the high frequency field power. The latter measurement may provide faster data acquisition since a single measurement can be used to characterize each of the electromagnetic field amplitudes of the reference, test, and superposition of the two fields. Images using the spectral response can also be acquired in short times, for example, by using a high-speed digital camera, thereby enabling high throughput.

Figure 2:
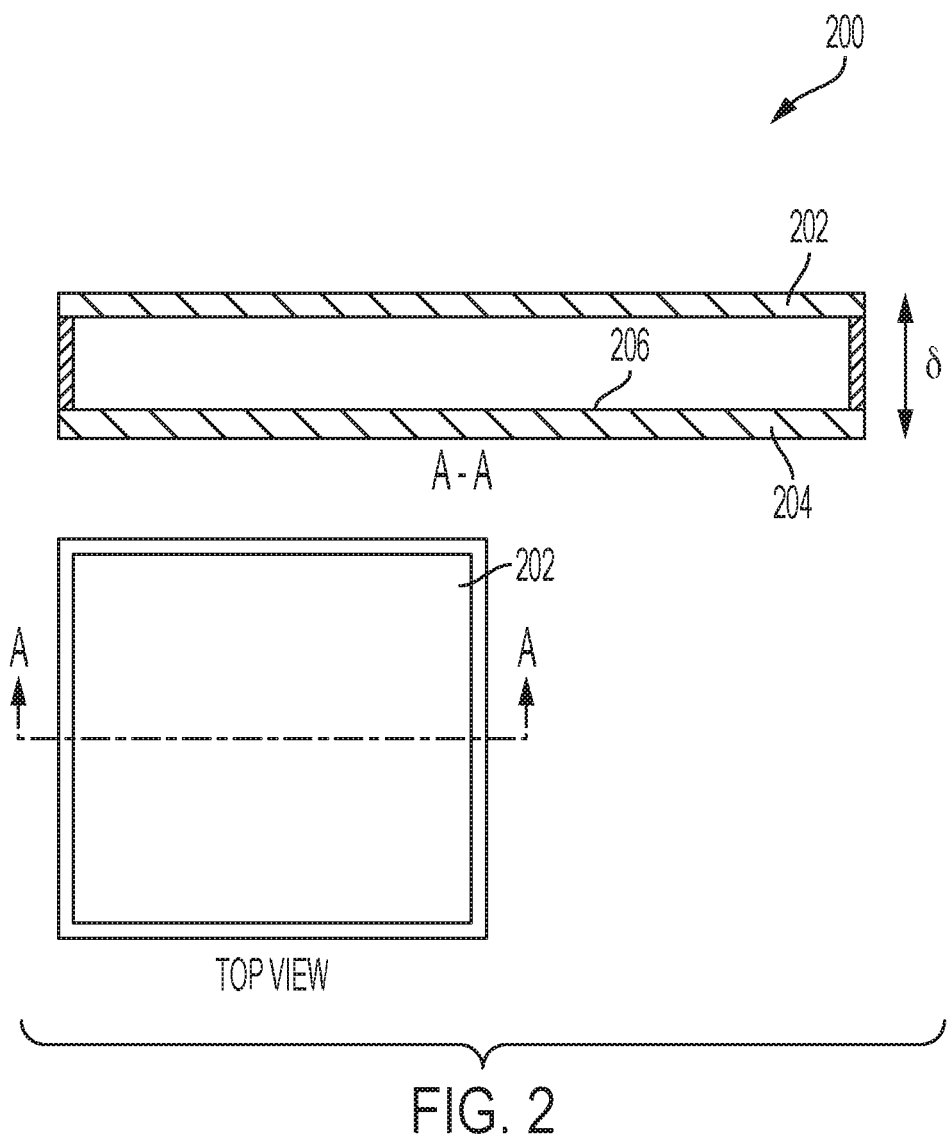
FIG. 2 a schematic diagram, in cross-section and top views, of an example vapor-cell sensor.

Now referring to FIG. 2, a schematic diagram is presented, in cross-section and top views, of an example vapor-cell sensor 200. The example vapor-cell sensor 200 may be analogous to the vapor-cell sensor 102 described in relation to FIG. 1. In some instances, the vapor-cell sensor 200 contains an alkali atom vapor such as Cs or Rb. The vapor-cell sensor 200 can be formed of dielectric materials such as glass and/or silicon. For example, one or more sides (or the frame) of the vapor-cell sensor 200 can be formed silicon. A back side 202 of the vapor-cell sensor 200, where the light enters, can be transparent, e.g., made from glass. A front side 204 of the vapor-cell sensor, which faces the DUT during operation, can be a ceramic material. However, an interior surface 206 of front side 204 may be coated with a reflective, dielectric material to act as a mirror for beams of light (e.g., laser light from a probe laser, laser light from a coupling laser, etc.). The dielectric mirror reflects the probe laser light (and in some instances the coupling laser light) back into an optical imaging system. It is not necessary to reflect the coupling laser light back to the optical imaging system, but in certain situations (e.g., where the scattered light is important), such reflection can be beneficial.

Materials such as high resistivity silicon may be chosen for the vapor-cell sensor 200 so that the test electromagnetic signal from the DUT is not absorbed and minimally reflected from the vapor-cell sensor 200. Glass, such as a borosilicate glass, and quartz can be used for the front and back surfaces of the vapor cell as well as the frame. A thickness of the vapor-cell sensor 200, represented by $\delta$ in FIG. 2, can be chosen to be small compared to a wavelength of the high frequency radiation that is being detected because the thickness determines the phase resolution. For example, the thickness of the vapor-cell sensor 200 can be $\delta < \lambda/8$ where $\lambda$ is the wavelength of the high frequency radiation. Other thicknesses may be used. The vapor-cell sensor 200 can be supported using thin silicon rods, thin carbon fibers, or another similar material. The rods may have a small scattering cross-section and absorption at the wavelengths being using for testing the DUT. The vapor-cell sensor 200 may act as a 'photographic plate' for the test field which is then transferred optically to an optical imaging device such as a fast CCD camera. The use of a fast CCD camera or similar device enables the digitization of the electromagnetic fields (or electromagnetic radiation) that are measured. An advantage of this process is that the image is recorded optically where fast image acquisition is more developed than at GHz-THz frequencies.

Figure 3:
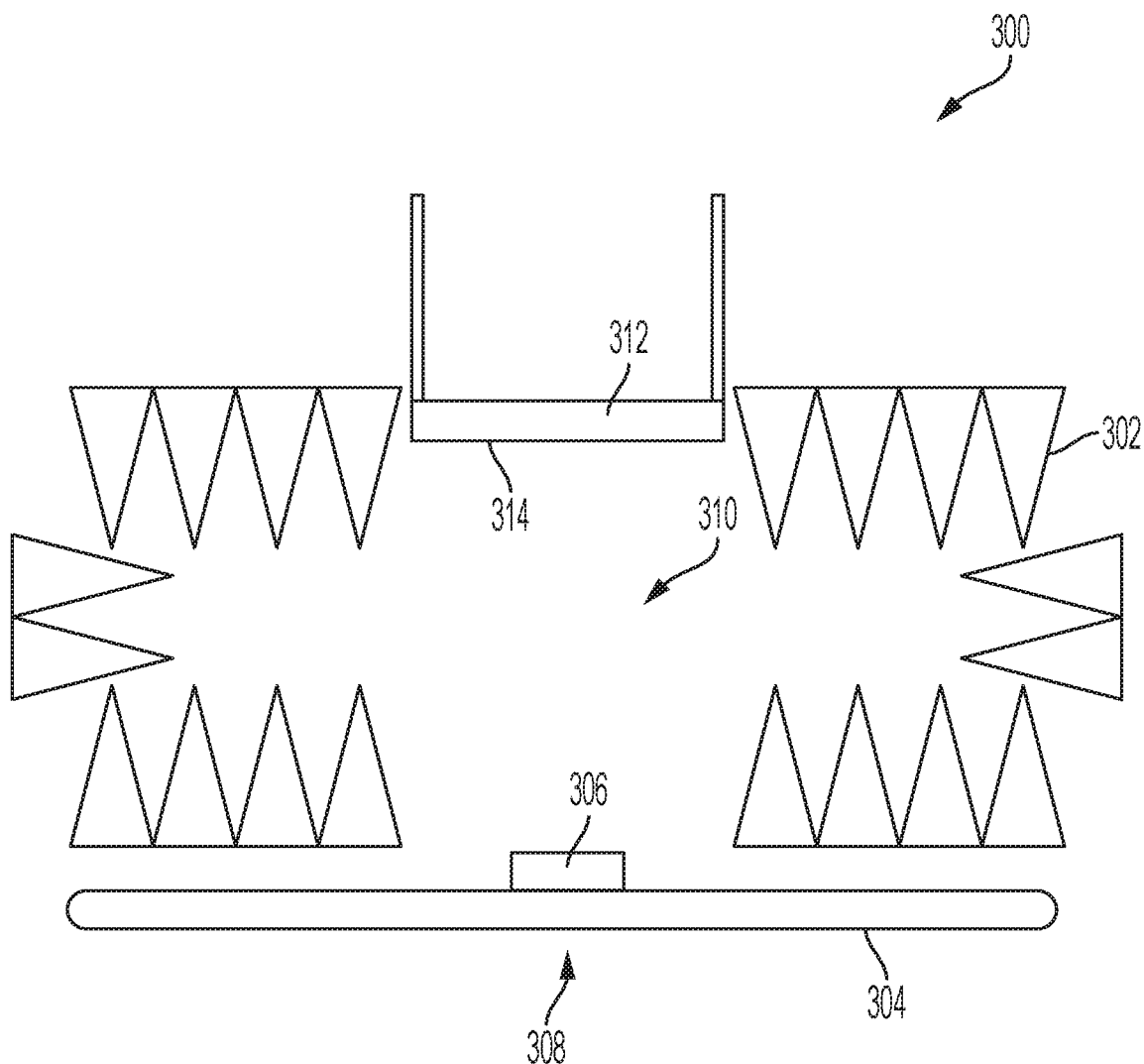
FIG. 3 is a schematic diagram of an example testing environment that includes microwave shielding and a transport system for moving a device-under-test to a target position for testing.

In some implementations, an imaging system includes microwave shielding that encloses a volume between the test device (or DUT) and the dielectric mirror of the vapor-cell sensor 200. FIG. 3 presents a schematic diagram of an example testing environment 300 that includes microwave shielding 302 and a transport system 304 for moving a device-under-test 306 to a target position for testing. The example testing environment 300 includes a volume 310 between the DUT 306 and a vapor-cell sensor 312 that spans an open distance between a dielectric mirror 314 of the vapor-cell sensor 312. During operation, test electromagnetic radiation from the DUT 306 may traverse the volume 310 to reach the vapor-cell sensor 312. The DUT 306 can be transported to the measurement via the transport system 304, which may be a conveyor belt or other robotic method. The DUT 306 can be socketed (e.g., electrically coupled) so that it has power. Power connections of the transport system 304 can be similar to or the same as what is used when the DUT 306 is deployed in-field. Microwave shielding 302 in the region between the vapor-cell sensor 312 and the DUT 306 can prevent reflections from objects located in the room where the testing is performed and the other elements of the apparatus.

Now referring back to FIG. 1, in some implementations, signals acquired by the optical imaging system 120 can be processed, for example, using a computer system. The computer system can use the images acquired to extract the amplitude and phase of the test wave in a plane of the vapor-cell sensor 102. The information on the amplitude and phase of the test wave at the plane of the vapor-cell sensor 102 can be propagated to another region of space to predict the signal there, such as by implementing an algorithm (e.g., a Fresnel transform). Recovery of the phase and amplitude in a plane allows the electromagnetic field to be numerically propagated. If the reference wave is known well-enough then it can be digitally used to extract the test wave without having to image the reference wave for each DUT that passes through the invention. The resolution of the electromagnetic field measurement as a fraction of measurement wavelength, $\lambda$, is higher than in some other contexts because it is set by the optical readout of the vapor-cell sensor 102 and not the spatial resolution of the optical imaging device (CCD array). For testing on an assembly line, the extracted test electromagnetic field can be run through a matched filter to determine how it conforms to a desired radiation pattern. A transmission level of conformance can be set and each device compared to the transmission level of conformance to judge if the DUT is properly working. Similarly, spatial correlations of the desired and test field could be used to pass or fail (or otherwise process) a DUT. In some implementations, the amplitude alone (without the phase information) produces enough information so that its measurement is useful, e.g., a field intensity in the plane of the vapor-cell sensor 102.

In some implementations, the imaging systems and techniques described herein use a vapor-cell sensor and atom-based electric field sensing that can work over the 0.1 GHz-THz range of frequency. The vapor-cell sensor includes portions formed of a dielectric material transparent to the electric fields. Rydberg atom electrometry uses light fields to set up each atom in a thermal vapor as an interferometer whose optical response is perturbed in a known way by an incident high frequency field (near)resonantly interacting via a Rydberg transition. The measurement of the electric field is linked to the properties of the atom, which can be established through precision measurements, and physical constants. The sensor can be made of dielectric materials and can be made thin so that it minimally perturbs the field and can yield high phase resolution. The measurement by the atoms contained in the vapor cell can be self-calibrated because it is linked to physical constants and properties of the atomic structure. This calibration can also be used to amplitude stabilize the reference wave. In some cases, the sensor is coupled remotely to the signal readout via free space optics. In this way, the signal is robust or immune to interference and attenuation. Free space optical coupling to the vapor cell sensor also reduces interference in the measurement process, for example, when there are no metallic wires to connect to it. The optical read-out provides for high spatial resolution of the electromagnetic field. The fields at the sensor can be digitized by reading out the optical response on an imaging device such as a high-speed CCD camera or array.

Figure 4A:
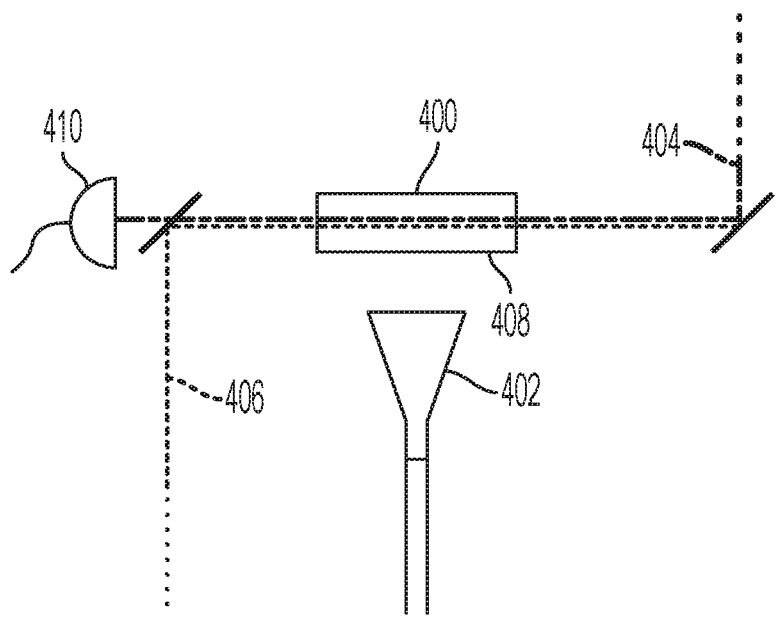
FIG. 4A is a schematic diagram of an example vapor-cell sensor positioned proximate an antenna configured to generate electromagnetic radiation.

Now referring to FIG. 4A, a schematic diagram is presented of an example vapor-cell sensor 400 positioned proximate an antenna 402 configured to generate electromagnetic radiation. The antenna 402 may generate electromagnetic radiation that corresponds to a reference electromagnetic radiation or a test electromagnetic radiation. The example vapor-cell sensor 400 is configured to receive input optical signals, and in response, generate one or more output optical signals. In FIG. 4A, the vapor-cell sensor 400 receives a probe beam of light 404 and a coupling beam of light 406. The probe beam of light 404 and the coupling beam of light 406 may be generated by respective lasers, such as a tunable laser or a diode laser. The probe beam of light 404 and the coupling beam of light 406 pass through the vapor-cell sensor 400 along a common optical pathway. A direction of travel along the common optical pathway may be the same for both beams. However, in some variations, each beam may travel in opposite directions along the common optical pathway. While doing pass through the vapor-cell sensor 400, the probe and coupling beams of light 404, 406 interact with atoms in a vapor state that are contained within an enclosure of the vapor-cell sensor 400. A side 408 of the enclosure facing the antenna 402 may be formed of a dielectric material transparent to the electromagnetic radiation, thereby serving as a window for the electromagnetic radiation. Other sides of the enclosure may also be formed of the dielectric material. Concomitant with receiving the probe beam of light 404 and the coupling beam of light 406, the vapor-cell sensor 400 may also receive the electromagnetic radiation (or portion thereof) through the side 408 of the enclosure. The electromagnetic radiation may alter an optical transmission of the probe beam of light 404 through the vapor-cell sensor 400, which is recorded by a detector 410. Measurements of the optical transmission or the probe beam of light 404 may allow the vapor-cell sensor 400 to measure characteristics of the electromagnetic radiation.

Figure 4B:
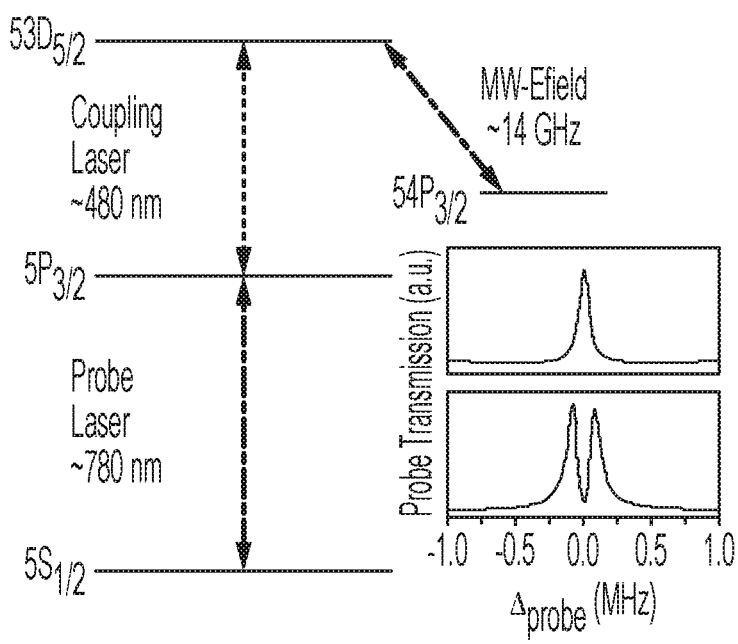
FIG. 4B is a schematic diagram of an example atomic energy level structure for a two-photon measurement based on $^{87}$Rb atoms in a vapor state.

Measurements of characteristics of the electromagnetic radiation may rely on two or more optical transitions associated with the atoms in a vapor state. FIG. 4B presents a schematic diagram of an example atomic energy level structure for a two-photon measurement based on $^{87}$Rb atoms in a vapor state. In FIG. 4B, light used to access the $5S_{1/2}$-to-$5P_{3/2}$ optical transition and the $5P_{3/2}$-to-$53D_{5/2}$ optical transition is generated from diode lasers. However, other types of lasers or laser systems may be used. A transmission of light from a probe laser is recorded in the presence of light from a coupling laser. If the electromagnetic radiation is not interacting with the $^{87}$Rb atoms, a narrow peak in probe light transmission is observed where the probe would normally be absorbed, as shown in the upper graph of the inset. Such a phenomenon may be referenced as an electromagnetically-induced transparency (EIT). When electromagnetic radiation interacts with the $^{87}$Rb atoms—and in particular when the electromagnetic radiation has an electric field component resonant with a third optical transmission of the $^{87}$Rb atoms—an absorption feature is induced within the narrow peak of probe light transmission, as shown in the lower graph. The absorption feature may split the narrow peak of probe light transmission into two transmission peaks. Measurements of the narrow peaks and the absorption feature are extremely sensitive to the electromagnetic radiation experienced by the vapor-cell sensor 400 because the Rydberg atom transitions have large transition dipole moments and the amplitude is converted to a frequency difference. Since EIT is a coherent multi-photon process, it is sub-Doppler so it can be done in a vapor-cell sensor with high spectral resolution. In some instances, imaging the test and reference electromagnetic fields can include acquiring several optical images as one of the laser frequencies is scanned in the vicinity of the EIT resonance.

In some implementations, a vapor-cell sensor may be formed at least in part of a dielectric material transparent to electromagnetic radiation generated by an antenna. The electromagnetic radiation may have wavelengths in the GHz-THz range, and the vapor-cell sensor may measure characteristics of the electromagnetic radiation using atom-based electric field sensing, such as described in relation to FIGS. 1 and 4A-4B. In particular, Rydberg atom electrometry may use light fields to set up each atom in a thermal vapor as an interferometer whose optical response is perturbed in a known way by an incident microwave field (or electromagnetic radiation). The incident microwave field may resonantly interact with each atom via a Rydberg transition as shown, for example, in FIG. 4B. Measurement of the electric field component is then linked to properties of the atom and corresponding physical constants, both of which, can be established through precision measurements carried out in specialized labs. Because the vapor-cell sensor is formed at least in part of the dielectric material, and because the vapor-cell sensor can also be made less than a wavelength in thickness, the presence of the vapor-cell sensor within the electromagnetic radiation may minimally perturb the electromagnetic radiation. Moreover, the measurement by the atoms contained in the vapor-cell sensor can be self-calibrated because the measurement is linked to physical constants and properties of atomic structure.

An atom-based sensor and measurement system for radio-frequency (RF) electric fields (or electromagnetic radiation) may utilize transitions of highly excited Rydberg atoms or other atomic-scale systems. For example, $^{87}$Rb or $^{133}$Cs atoms or other types of atoms prepared (e.g., partially) in Rydberg states, color centers in dielectric matrices, or other types of atomic-scale systems may be used. The atom-based sensor may generally operate, for example, by detecting how RF electric fields affect optical transitions of the atoms. The atoms can be setup as a coherent quantum interferometer with laser fields using the principle of electromagnetically induced transparency (EIT), for example, as shown in FIG. 4B. In EIT, light from a resonant probe laser beam is transmitted through a normally absorbing material due to the presence of a strong coupling laser beam. The probe and coupling fields create quantum interference in the atom so absorption of the probe beam interferes destructively with the process of probe beam absorption and coherent excitation and de-excitation by the coupling beam. As a result, a spectrally-narrow transmission window can be created in a normally absorbing material. If an RF electric field is resonant with another transition (e.g., see FIG. 4B), the RF electric field can change the interference in the atom to induce a narrow absorption feature or split the transmission line shape that is observed as a function of the probe laser frequency.

Frequency splitting of the EIT transmission peaks, $\Delta v$, is ideally proportional to a peak amplitude, $E_0$, and depends only on the transition dipole moment, $\mu_{RF}$, of the Rydberg atom transition and Planck's constant, h, $$E_0 = \frac{h\Delta v}{\mu_{RF}} \quad (1)$$

an example of which, is shown in FIG. 4B. The amplitude changes of the EIT transmission peak due to the incident radiation are proportional to $E_0^2$ and can also be used to measure the incident power of the radiation field. If the response is nonlinear, under conditions where inhomogeneous broadening plays a large role, the effect of an electric field component on the probe laser transmission can be calculated to high accuracy because the Rydberg atom properties are well-known. If the probe laser is scanned in frequency in a counter-propagating coupling and probe laser geometry, the right-hand side of the expression for $E_0$ is multiplied by the ratio of probe, $\lambda_p$, to coupling laser, $\lambda_c$, wavelengths due to the residual Doppler effects caused by the wavelength mismatch. These wavelengths can be determined routinely to 1 part in $10^7$, using a Michelson interferometer, and to much higher accuracy in some cases. $\mu_{RF}$ is currently known to between 0.1-1%. Higher precision is possible, for example, if experiments are done to determine $\mu_{RF}$ using ultra-stable lasers referenced to frequency combs. The approach is a self-calibrated way to measure electric fields in the GHz-THz regime, lower fields being in the 100 MHz regime. It is linked to precision measurements of the atom and physical constants. As an example, a minimum detectable absolute electric field amplitude of about 1 µV cm$^{-1}$ with a sensitivity of about 3 µV cm$^{-1}$ Hz$^{-1/2}$ using the absorptive signal at RF frequencies in the 5-20 GHz range, has been observed. For certain contexts, the calculated shot noise limit is ~pV cm$^{-1}$, indicating that large improvements can be realized. Phase can also be measured, for instance, provided a reference wave is present—for example, using a second antenna as shown in FIG. 1.

Figure 5:
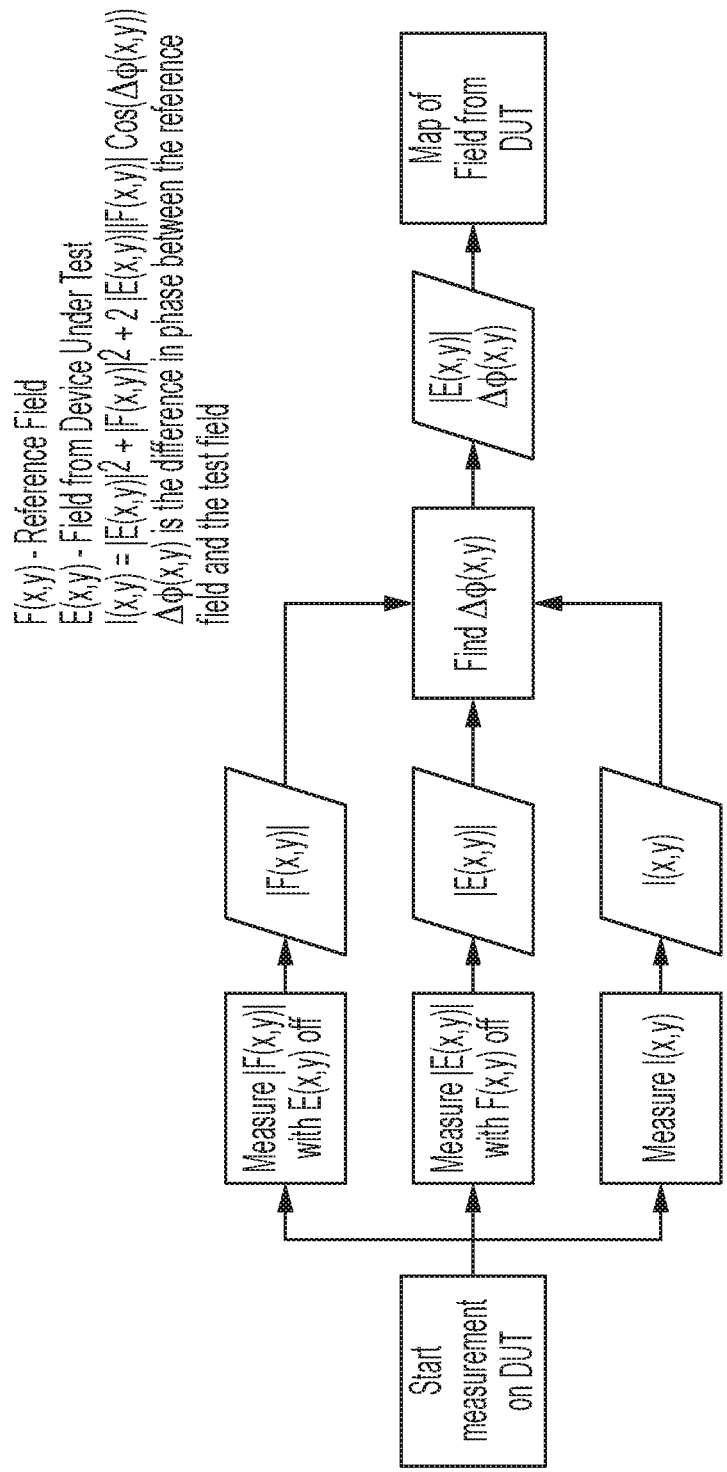
FIG. 5 is a flow chart showing a possible sequence of measurements that can be used to extract the phase and amplitude of the test wave of electromagnetic radiation.

In some implementations, a vapor-cell sensor detects the power of the incident electromagnetic wave. A reference wave is used to extract phase since the phase can be referenced to another phase, or equivalent timing signal. FIG. 5 presents a flow chart showing a possible sequence of measurements that can be used to extract the phase and amplitude of the test wave of electromagnetic radiation. These measurements are similar to heterodyne holography where the signals are changed in time. In the flow chart, the coordinates x and y denote a position of the measurement on the surface of the sensor, which is assumed to planar. The electric field component at position (x,y) from the DUT is denoted E(x,y) while that from the test wave of electromagnetic radiation is denoted F(x, y). Ideally, F(x,y) is a plane wave which has the same frequency as the test wave, $$F(x,y) = Ae^{-i2\pi\alpha y} \quad (2)$$

with $\alpha$ is defined as (see FIG. 1), $$\alpha = \frac{\sin 2\theta}{\lambda} \quad (3)$$

The field measurements of |E(x,y)| and |F(x,y)| are used to extract the phase, $\Delta\phi(x,y) = \phi_{ref}(x,y) - \phi_{test}(x,y)$, from the measurement of the superposed waves I(x,y), $$I(x,y) = |E(x,y)|^2 + |F(x,y)|^2 + 2|E(x,y)||F(x,y)|\cos(2\pi\alpha y + \Delta\phi(x,y)) \quad (4)$$

$\Delta\phi(x,y)$ is the phase difference between the reference wave of electromagnetic radiation and the test wave of electromagnetic radiation at point (x,y) on the vapor-cell sensor. The extraction of the phase and amplitude can be done digitally on a computer as can the propagation of the wave front to determine its structure at different spatial positions.

An alternative way to extract the amplitude and phase is to phase shift the test wave by a known amount, making a minimum measurement of I(x,y) for three different known reference phases. The three values of I(x,y) can be used to determine the amplitude and phase of the test wave of electromagnetic radiation. Using three different phase shifts to determine the test wave of electromagnetic radiation is analogous to phase-shifting holography. In a general sense, for some systems, there are three unknowns: the test wave amplitude, the reference wave amplitude, and the relative phase between the two waves of electromagnetic radiation. With three unknowns, any three linearly independent measurements can be used to solve equations equivalent to Equation (4) for the unknowns. These linearly independent measurements can be some combination of I(x,y) measurements using different reference phases or measurements carried out by modulating the reference and test fields. A priori knowledge of one of the variables reduces the number of necessary measurements. For example, the measurement in each example case can be reduced if the reference wave of electromagnetic radiation is stable enough for a given application, because it then only has to be measured once and its digital record used to calculate the phase and amplitude of the test wave. The stability of the reference wave of electromagnetic radiation can be enhanced by using a single or several Rydberg atom-based power sensors (or vapor-cell sensors) to actively monitor the power emitted from the antenna generating the reference wave of electromagnetic radiation at one or several different positions. The same light sources used for the measurement of the DUT can be used for the active stabilization of the reference wave of electromagnetic radiation.

Since the measurement of the power is linked to properties of the atom through the transition dipole moments and fundamental constants that can be measured to high precision in a controlled laboratory environment, an absolute, self-calibrated measurement of the electric field, thus the emitted power from the DUT, may be provided. The measurement can therefore act as a standard for each DUT. In some cases, a holographic measurement device can provide a fully self-calibrated measurement since the reference wave power can be calibrated and stabilized with a Rydberg atom-based power sensor as a reference using a feedback loop. The geometry of the vapor cell sensor can be known to 10 micron or less precision by laser cutting the vapor cell frame or etching the vapor cell structure. OTA testing may be useful to many different stake holders, including telecommunications carriers, electronics manufacturers, and regulatory bodies. OTA testing which can be linked to standards can provide compliance with law and help to avoid costly design errors. Compliance and testing can help the high frequency electronics industry meet demanding global market schedules and technical specifications.

According to some implementations, an imaging method includes receiving electromagnetic radiation at a vapor-cell sensor and passing beams of light through the vapor-cell sensor. One or more of the beams of light reflect off a dielectric mirror of the vapor-cell sensor. The method also includes receiving at least one of the beams of light at an optical imaging system. The optical imaging system is configured to measure spatial properties of a beam of light. The method additionally includes determining one or both of an amplitude and a phase (i.e., determining only an amplitude, determining only a phase, or determining both an amplitude and a phase) of the electromagnetic radiation based on spatial properties of the at least one received beam of light. In some instances, the determined amplitude of the electromagnetic radiation includes a spatially-dependent amplitude and the method includes determining the spatially-dependent amplitude. In some instances, the determined phase of the electromagnetic radiation includes a spatially-dependent phase and the method includes determining the spatially-dependent phase.

In some implementations, one of the beams of light is received at the optical imaging system. In these implementations, one or both of the amplitude and the phase of the electromagnetic radiation are determined based on spatial properties of the one received beam of light. In some implementations, two of the beams of light are received at the optical imaging system. In these implementations, one or both of the amplitude and the phase of the electromagnetic radiation are determined based on spatial properties of the two received beams of light.

In some implementations, the beams of light consist of two beams of light. In other implementations, the beams of light consist of three beams of light.

In some implementations, the method includes controlling one or both of an amplitude and a phase of electromagnetic radiation to generate a reference electromagnetic radiation, and receiving the reference electromagnetic radiation at the vapor-cell sensor. In these implementations, determining one or both of the amplitude and the phase of the electromagnetic radiation includes determining one or both of a reference amplitude and a reference phase of the reference electromagnetic radiation. In further implementations, the imaging method includes determining a difference of the reference electromagnetic radiation. The difference includes one or both of a difference between the reference amplitude and a target reference amplitude and a difference between the reference phase and a target reference phase. The imaging method also includes altering one or both of the reference amplitude and the reference phase of the reference electromagnetic radiation in response to determining the difference of the reference electromagnetic radiation. The reference electromagnetic radiation may be a plane wave of electromagnetic radiation.

In some implementations, the method includes generating a test electromagnetic radiation from a test device adjacent the vapor-cell sensor, and receiving the test electromagnetic radiation at the vapor-cell sensor. In these implementations, determining one or both of the amplitude and the phase of the electromagnetic radiation includes determining one or both of a test amplitude and a test phase of the test electromagnetic radiation. In some instances, the test amplitude of the test electromagnetic radiation includes a spatially-dependent test amplitude and the method includes determining the spatially-dependent test amplitude. In some instances, the test phase of the test electromagnetic radiation includes a spatially-dependent test phase and the method includes determining the spatially-dependent test phase. In further implementations, the imaging method includes determining a difference of the test electromagnetic radiation. The difference includes one or both of a difference between the test amplitude and a target test amplitude and a difference between the test phase and a target test phase.

In some implementations, the method includes controlling one or both of an amplitude and a phase of electromagnetic radiation to generate a reference electromagnetic radiation. The method also includes generating a test electromagnetic radiation from a test device adjacent the vapor-cell sensor and superimposing, at the vapor-cell sensor, the test electromagnetic radiation over the reference electromagnetic radiation, thereby producing a superimposed electromagnetic radiation. In these implementations, determining one or both of the amplitude and the phase of the electromagnetic radiation includes determining one or both of a superimposed amplitude and a superimposed phase of the superimposed electromagnetic radiation based on spatial properties of the at least one received beam of light. Determining one or both of the amplitude and the phase of the electromagnetic radiation also includes determining one or both of a test amplitude and a test phase of the test electromagnetic radiation based on one or both the reference amplitude and the reference phase of the reference electromagnetic radiation and one or both of the superimposed amplitude and the superimposed phase of the superimposed electromagnetic radiation. In some instances, the test amplitude of the test electromagnetic radiation includes a spatially-dependent test amplitude and the method includes determining the spatially-dependent test amplitude. In some instances, test phase of the test electromagnetic radiation includes a spatially-dependent test phase and the method includes determining the spatially-dependent test phase.

In some implementations where the superimposed electromagnetic radiation is produced, the imaging method may include determining a difference of the test electromagnetic radiation. The difference includes one or both of a difference between the test amplitude and a target test amplitude and a difference between the test phase and a target test phase.

In other implementations where the superimposed electromagnetic radiation is produced, the imaging method may include altering the reference phase of the reference electromagnetic radiation to generate at least three instances of superimposed electromagnetic radiation, each instance corresponding to an instance of reference electromagnetic radiation at a different reference phase. In such implementations, the test amplitude and the test phase of the test electromagnetic radiation are determined based on one or both of a superimposed amplitude and a superimposed phase for each instance of superimposed electromagnetic radiation and one or both of a reference amplitude and a reference phase for each corresponding instance of reference electromagnetic radiation.

In some implementations, the imaging method includes absorbing or reflecting at least one of the beams of light to pass wavelengths of the remaining beams of light to the optical imaging system.

An imaging method for producing images of electromagnetic radiation may be also be described by the following examples:

Example 1

An imaging method, comprising:
receiving electromagnetic radiation at a vapor-cell sensor;
passing beams of light through the vapor-cell sensor, one or more of the beams of light reflecting off a dielectric mirror of the vapor-cell sensor;
receiving at least one of the beams of light at an optical imaging system, the optical imaging system configured to measure spatial properties of a beam of light; and
determining one or both of an amplitude and a phase (i.e., determining only an amplitude, determining only a phase, or determining both an amplitude and a phase)

of the electromagnetic radiation based on spatial properties of the at least one received beam of light.

Example 2

The imaging method of example 1, wherein the amplitude of the electromagnetic radiation comprises a spatially-dependent amplitude, and the method comprises determining the spatially-dependent amplitude of the electromagnetic radiation.

Example 3

The imaging method of example 1 or 2, wherein the phase of the electromagnetic radiation comprises a spatially-dependent phase, and the method comprises determining the spatially-dependent phase of the electromagnetic radiation.

Example 4

The imaging method of example 1 or any of examples 2-3, wherein one of the beams of light is received at the optical imaging system; and wherein one or both of the amplitude and the phase of the electromagnetic radiation are determined based on spatial properties of the one received beam of light.

Example 5

The imaging method of example 1 or any of examples 2-3,
wherein two of the beams of light are received at the optical imaging system; and
wherein one or both of the amplitude and the phase of the electromagnetic radiation are determined based on spatial properties of the two received beams of light.

Example 6

The imaging method of example 1 or any of examples 2-5, wherein the beams of light consist of two beams of light.

Example 7

The imaging method of example 1 or any of examples 2-5, where the beams of light consist of three beams of light.

Example 8

The imaging method of example 1 or any of examples 2-7, comprising:
controlling one or both of an amplitude and a phase of electromagnetic radiation to generate a reference electromagnetic radiation;
receiving the reference electromagnetic radiation at the vapor-cell sensor; and
wherein determining one or both of the amplitude and the phase of the electromagnetic radiation comprises determining one or both of a reference amplitude and a reference phase of the reference electromagnetic radiation.

Example 9

The imaging method of example 8, comprising:
determining a difference of the reference electromagnetic radiation, the difference comprising one or both of a difference between the reference amplitude and a target reference amplitude and a difference between the reference phase and a target reference phase; and
altering one or both of the reference amplitude and the reference phase of the reference electromagnetic radiation in response to determining the difference of the reference electromagnetic radiation.

Example 10

The imaging method of example 8 or 9, wherein the reference electromagnetic radiation is a plane wave of electromagnetic radiation.

Example 11

The imaging method of example 1 or any of examples 2-10, comprising:
generating a test electromagnetic radiation from a test device adjacent the vapor-cell sensor;
receiving the test electromagnetic radiation at the vapor-cell sensor; and
wherein determining one or both of the amplitude and the phase of the electromagnetic radiation comprises determining one or both of a test amplitude and a test phase of the test electromagnetic radiation.

Example 12

The imaging method of example 11, wherein the test amplitude of the test electromagnetic radiation comprises a spatially-dependent test amplitude, and the method comprises determining the spatially-dependent test amplitude.

Example 13

The imaging method of example 11 or 12, wherein the test phase of the test electromagnetic radiation comprises a spatially-dependent test phase, and the method comprises determining the spatially-dependent test phase.

Example 14

The imaging method of example 11 or any of examples 12-13, comprising:
determining a difference of the test electromagnetic radiation, the difference comprising one or both of a difference between the test amplitude and a target test amplitude and a difference between the test phase and a target test phase.

Example 15

The imaging method of example 1 or any of examples 2-7, comprising:
controlling one or both of an amplitude and a phase of electromagnetic radiation to generate a reference electromagnetic radiation;
generating a test electromagnetic radiation from a test device adjacent the vapor-cell sensor;

superimposing, at the vapor-cell sensor, the test electromagnetic radiation over the reference electromagnetic radiation, thereby producing a superimposed electromagnetic radiation; and wherein determining one or both of the amplitude and the phase of the electromagnetic radiation comprises:
  determining one or both of a superimposed amplitude and a superimposed phase of the superimposed electromagnetic radiation based on spatial properties of the at least one received beam of light, and
  determining one or both of a test amplitude and a test phase of the test electromagnetic radiation based on one or both the reference amplitude and the reference phase of the reference electromagnetic radiation and one or both of the superimposed amplitude and the superimposed phase of the superimposed electromagnetic radiation.

Example 16

The imaging method of example 15, wherein the test amplitude of the test electromagnetic radiation comprises a spatially-dependent test amplitude, and the method comprises determining the spatially-dependent test amplitude.

Example 17

The imaging method of example 15 or 16, wherein the test phase of the test electromagnetic radiation comprises a spatially-dependent test phase, and the method comprises determining the spatially-dependent test phase.

Example 18

The imaging method of example 15 or any of examples 16-17, comprising:
  determining a difference of the test electromagnetic radiation, the difference comprising one or both of a difference between the test amplitude and a target test amplitude and a difference between the test phase and a target test phase.

Example 19

The imaging method of example 15 or any of examples 16-17, comprising:
  altering the reference phase of the reference electromagnetic radiation to generate at least three instances of superimposed electromagnetic radiation, each instance corresponding to an instance of reference electromagnetic radiation at a different reference phase; and
  wherein the test amplitude and the test phase of the test electromagnetic radiation are determined based on one or both of a superimposed amplitude and a superimposed phase for each instance of superimposed electromagnetic radiation and one or both of a reference amplitude and a reference phase for each corresponding instance of reference electromagnetic radiation.

Example 20

The imaging method of example 1 or any of examples 2-19, comprising:
  absorbing or reflecting at least one of the beams of light to pass wavelengths of the remaining beams of light to the optical imaging system.

An imaging system for producing images of electromagnetic radiation may be also be described by the following examples:

Example 21

An imaging system, comprising:
  a vapor-cell sensor comprising an optical window and a dielectric mirror;
  a laser system configured to generate at least two beams of light;
  a reference antenna disposed on a side of the vapor-cell sensor associated with the optical window, the reference antenna configured to generate a reference electromagnetic radiation having one or both of a controlled amplitude and a controlled phase; and
  an optical imaging system configured to measure spatial properties of a beam of light and positioned to receive at least one of the at least two beams of light after interaction with the vapor-cell sensor.

Example 22

The imaging system of example 21, comprising a test device disposed adjacent the dielectric mirror of the vapor-cell sensor and configured to generate test electromagnetic radiation.

Example 23

The imaging system of example 22, comprising microwave shielding that encloses a volume between the test device and the dielectric mirror of the vapor-cell sensor.

Example 24

The imaging system of example 21 or any of examples 22-23, wherein the optical window and the dielectric mirror are planar in shape and parallel to each other.

Example 25

The imaging system of example 21 or any of examples 22-24, comprising:
  a first optical pathway extending from the laser system, through the optical window of the vapor-cell sensor, to the dielectric mirror;
  an optical assembly disposed on the first optical pathway between the laser system and the optical window of the vapor-cell sensor; and
  a second optical pathway extending from the optical assembly to the optical imaging system;
  wherein the optical assembly is configured to redirect at least one beam of light onto the second optical pathway after interaction with the vapor-cell sensor.

Example 26

The imaging system of example 25, wherein the optical assembly comprises a waveplate disposed on the first optical pathway between the optical window and the optical assembly.

Example 27

The imaging system of example 25 or 26, wherein the optical assembly comprises a lens disposed on the first optical pathway between the optical window and the optical assembly.

Example 28

The imaging system of example 25 or any of examples 26-27, wherein the optical assembly includes an optical filter disposed on the second optical pathway and configured to absorb or reflect wavelengths of at least one of the at least two beams of light.

Example 29

The imaging system of example 21 or any of examples 22-28, comprising a computer system in communication with the optical imaging system and configured to generate data from spatial properties of at least one beam of light received by the optical imaging system, the data representing one or both of a spatially-dependent amplitude and a spatially-dependent phase of electromagnetic radiation.

Example 30

The imaging system of example 21 or any of examples 22-29, wherein the optical imaging system comprises a charge-coupled device.

Example 31

The imaging system of example 21 or any of examples 22-30, wherein the laser system is configured to generate two beams of light.

Example 32

The imaging system of example 21 or any of examples 22-31, wherein the laser system is configured to generate three beams of light.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. An imaging method, comprising:
   receiving, at a vapor-cell sensor, electromagnetic radiation from a source of the electromagnetic radiation;
   passing beams of light from a laser system through the vapor-cell sensor, one or more of the beams of light reflecting off a dielectric mirror of the vapor-cell sensor;
   receiving at least one of the beams of light at an optical imaging system, the optical imaging system configured to measure spatial properties of a beam of light; and
   determining one or both of an amplitude and a phase of the electromagnetic radiation based on spatial properties of the at least one received beam of light.

2. The imaging method of claim 1, wherein the amplitude of the electromagnetic radiation comprises a spatially-dependent amplitude, and the method comprises determining the spatially-dependent amplitude of the electromagnetic radiation.

3. The imaging method of claim 1, wherein the phase of the electromagnetic radiation comprises a spatially-dependent phase, and the method comprises determining the spatially-dependent phase of the electromagnetic radiation.

4. The imaging method of claim 1,
   wherein one of the beams of light is received at the optical imaging system; and
   wherein one or both of the amplitude and the phase of the electromagnetic radiation are determined based on spatial properties of the one received beam of light.

5. The imaging method of claim 1,
   wherein two of the beams of light are received at the optical imaging system; and
   wherein one or both of the amplitude and the phase of the electromagnetic radiation are determined based on spatial properties of the two received beams of light.

6. The imaging method of claim 1, wherein the beams of light consist of two beams of light.

7. The imaging method of claim 1, wherein the beams of light consist of three beams of light.

8. The imaging method of claim 1, comprising:
   controlling one or both of an amplitude and a phase of electromagnetic radiation from a reference antenna to generate a reference electromagnetic radiation, the source of electromagnetic radiation comprising the reference antenna;
   wherein receiving electromagnetic radiation at the vapor-cell sensor comprises receiving the reference electromagnetic radiation at the vapor-cell sensor; and
   wherein determining one or both of the amplitude and the phase of the electromagnetic radiation comprises determining one or both of a reference amplitude and a reference phase of the reference electromagnetic radiation.

9. The imaging method of claim 8, comprising:
   determining a difference of the reference electromagnetic radiation, the difference comprising one or both of a difference between the reference amplitude and a target reference amplitude and a difference between the reference phase and a target reference phase; and
   altering one or both of the reference amplitude and the reference phase of the reference electromagnetic radiation in response to determining the difference of the reference electromagnetic radiation.

10. The imaging method of claim 8, wherein the reference electromagnetic radiation is a plane wave of electromagnetic radiation.

11. The imaging method of claim 1, comprising:
generating a test electromagnetic radiation from a test device adjacent the vapor-cell sensor, the source of electromagnetic radiation comprising the test device;
wherein receiving electromagnetic radiation at the vapor-cell sensor comprises receiving the test electromagnetic radiation at the vapor-cell sensor; and
wherein determining one or both of the amplitude and the phase of the electromagnetic radiation comprises determining one or both of a test amplitude and a test phase of the test electromagnetic radiation.

12. The imaging method of claim 11, wherein the test amplitude of the test electromagnetic radiation comprises a spatially-dependent test amplitude, and the method comprises determining the spatially-dependent test amplitude.

13. The imaging method of claim 11, wherein the test phase of the test electromagnetic radiation comprises a spatially-dependent test phase, and the method comprises determining the spatially-dependent test phase.

14. The imaging method of claim 11, comprising:
determining a difference of the test electromagnetic radiation, the difference comprising one or both of a difference between the test amplitude and a target test amplitude and a difference between the test phase and a target test phase.

15. The imaging method of claim 1, comprising:
controlling one or both of an amplitude and a phase of electromagnetic radiation from a reference antenna to generate a reference electromagnetic radiation, the source of electromagnetic radiation comprising the reference antenna;
generating a test electromagnetic radiation from a test device adjacent the vapor-cell sensor, the source of electromagnetic radiation comprising the test device; and
superimposing, at the vapor-cell sensor, the test electromagnetic radiation over the reference electromagnetic radiation, thereby producing a superimposed electromagnetic radiation;
wherein receiving electromagnetic radiation at the vapor-cell sensor comprises receiving the reference electromagnetic radiation and the test electromagnetic radiation at the vapor-cell sensor; and
wherein determining one or both of the amplitude and the phase of the electromagnetic radiation comprises:
determining one or both of a superimposed amplitude and a superimposed phase of the superimposed electromagnetic radiation based on spatial properties of the at least one received beam of light, and
determining one or both of a test amplitude and a test phase of the test electromagnetic radiation based on one or both the reference amplitude and the reference phase of the reference electromagnetic radiation and one or both of the superimposed amplitude and the superimposed phase of the superimposed electromagnetic radiation.

16. The imaging method of claim 15, wherein the test amplitude of the test electromagnetic radiation comprises a spatially-dependent test amplitude, and the method comprises determining the spatially-dependent test amplitude.

17. The imaging method of claim 15, wherein the test phase of the test electromagnetic radiation comprises a spatially-dependent test phase, and the method comprises determining the spatially-dependent test phase.

18. The imaging method of claim 15, comprising:
determining a difference of the test electromagnetic radiation, the difference comprising one or both of a difference between the test amplitude and a target test amplitude and a difference between the test phase and a target test phase.

19. The imaging method of claim 15, comprising,
altering the reference phase of the reference electromagnetic radiation to generate at least three instances of superimposed electromagnetic radiation, each instance corresponding to an instance of reference electromagnetic radiation at a different reference phase; and
wherein the test amplitude and the test phase of the test electromagnetic radiation are determined based on one or both of a superimposed amplitude and a superimposed phase for each instance of superimposed electromagnetic radiation and one or both of a reference amplitude and a reference phase for each corresponding instance of reference electromagnetic radiation.

20. The imaging method of claim 1, comprising:
absorbing or reflecting at least one of the beams of light to pass wavelengths of the remaining beams of light to the optical imaging system.

21. An imaging system, comprising:
a vapor-cell sensor comprising an optical window and a dielectric mirror;
a laser system configured to generate at least two beams of light;
a reference antenna disposed on a side of the vapor-cell sensor associated with the optical window, the reference antenna configured to generate a reference electromagnetic radiation having one or both of a controlled amplitude and a controlled phase; and
an optical imaging system configured to measure spatial properties of a beam of light and positioned to receive at least one of the at least two beams of light after interaction with the vapor-cell sensor.

22. The imaging system of claim 21, comprising a test device disposed adjacent the dielectric mirror of the vapor-cell sensor and configured to generate test electromagnetic radiation.

23. The imaging system of claim 22, comprising microwave shielding that encloses a volume between the test device and the dielectric mirror of the vapor-cell sensor.

24. The imaging system of claim 21, wherein the optical window and the dielectric mirror are planar in shape and parallel to each other.

25. The imaging system of claim 21, comprising:
a first optical pathway extending from the laser system, through the optical window of the vapor-cell sensor, to the dielectric mirror;
an optical assembly disposed on the first optical pathway between the laser system and the optical window of the vapor-cell sensor; and
a second optical pathway extending from the optical assembly to the optical imaging system;
wherein the optical assembly is configured to redirect at least one beam of light onto the second optical pathway after interaction with the vapor-cell sensor.

26. The imaging system of claim 25, wherein the optical assembly comprises a waveplate disposed on the first optical pathway between the optical window and the optical assembly.

27. The imaging system of claim 25, wherein the optical assembly includes an optical filter disposed on the second optical pathway and configured to absorb or reflect wavelengths of at least one of the at least two beams of light.

28. The imaging system of claim 21, wherein the optical imaging system comprises a charge-coupled device.

29. The imaging system of claim 21, wherein the laser system is configured to generate two beams of light.

30. The imaging system of claim 21, wherein the laser system is configured to generate three beams of light.

31. The imaging system of claim 25, wherein the optical assembly comprises a lens disposed on the first optical pathway between the optical window and the optical assembly.

32. The imaging system of claim 21, comprising a computer system in communication with the optical imaging system and configured to generate data from spatial properties of at least one beam of light received by the optical imaging system, the data representing one or both of a spatially-dependent amplitude and a spatially-dependent phase of electromagnetic radiation.

* * * * *